United States Patent [19]

Csanky

[11] Patent Number: 4,820,999

[45] Date of Patent: Apr. 11, 1989

[54] METHOD AND APPARATUS FOR AMPLIFYING SIGNALS

[75] Inventor: Geza Csanky, Manhattan Beach, Calif.

[73] Assignee: The Aerospace Corporation, El Segundo, Calif.

[21] Appl. No.: 96,563

[22] Filed: Sep. 11, 1987

[51] Int. Cl.$^4$ .............................................. H03F 3/16
[52] U.S. Cl. ..................................... 330/277; 330/310
[58] Field of Search ............... 330/253, 264, 277, 310, 330/311

[56] References Cited

U.S. PATENT DOCUMENTS

| | | | |
|---|---|---|---|
| 3,271,633 | 9/1966 | Csanky | 317/234 |
| 4,247,824 | 1/1981 | Hilbourne | 330/277 X |
| 4,342,967 | 8/1982 | Regan et al. | 330/277 |
| 4,518,926 | 5/1985 | Swanson | 330/277 X |

OTHER PUBLICATIONS

Hodges, D. A., Gray, P. R., and Brodersen, R. W., "Potential of MOS Technologies for Analog Integrated Circuits," *IEEE Journal of Solid-State Circuits*, vol. SC-13, No. 3, Jun. 1978, pp. 285-294.
Wallman, H. MacNee, A. B., and Gadsden, C. P., "A Low-Noise Amplifier", *Proceedings of the I.R.E.*, Jun. 1948, pp. 700-708.
Tsividis, Y. P., "Design Considerations in Single-Channel MOS Analog Integrated Circuits—A Tutorial", *IEEE Journal of Solid-State Circuits*, vol. SC-13, No. 3, Jun. 1978, pp. 383-391.
Csanky, G., "Combining FETs for Higher Gains", *Electronic Design*, Sep. 27, 1963, pp. 36-44.
Dunne, T., Emmens, T., and Tuthill, M., "CMOS A-D Converter Chip Pushes Out 12 Bits in Record-Setting 5 $\mu$s", *Electronic Design*, Dec. 12, 1985, pp. 93-100.
Goodenough, F., "ADC Chips Leap Ahead Both in Speed and Accuracy", *Electronic Design*, Sep. 4, 1985, pp. 90-97.
Gray, P. R. and Meyer, R. G., "MOS Operational Amplifier Design-A Tutorial Overview," *IEEE Journal of Solid-State Circuits*, vol. SC-17, No. 6, Dec. 1982, pp. 969-982.
Vittoz, E. and Fellrath, J., "CMOS Analog Integrated Circuits Based on Weak Inversion Operation," *IEEE Journal of Solid-State Circuits*, vol. SC-12, No. 3, Jun. 1977, pp. 224-230.
Gray, P. R. and Meyer, R. G., *Analysis and Design of Analog Integrated Circuits*, John Wiley & Sons, New York, 1984, pp. 191-194, 711-714.

*Primary Examiner*—Steven Mottola
*Attorney, Agent, or Firm*—William J. Burke

[57] ABSTRACT

A method and apparatus for amplifying signals is disclosed. In one embodiment, the apparatus comprises a first MOSFET having a drain, a source and a gate. The apparatus further comprises a second MOSFET having a drain, a source and a gate. The second MOSFET is a depletion mode device having a substantially greater drain saturation current than the first MOSFET. The drain of the first MOSFET is connected to the source of the second MOSFET through a first conductor, and the source of the first MOSFET is connected to the gate of the second MOSFET through a second conductor. Finally, the apparatus further comprises a conductor for connecting the drain of the second MOSFET to biasing source to apply sufficient voltage to cause saturation of the first and second MOSFETs.

18 Claims, 2 Drawing Sheets

METHOD AND APPARATUS FOR AMPLIFYING SIGNALS

BACKGROUND OF THE INVENTION

1. Technical Field

This invention relates to analog circuits, and more particularly concerns a method and apparatus for amplifying signals.

2. Description of the Related Art

Analog circuits are often used in a broad range of signal-processing applications such as analog-to-digital converters. Such converters generally use a plurality of amplifiers and resistors to produce a digital output in response to an analog input from physical motion detectors or electrical voltages. While the amplifiers used with such analog circuits may be of different types, several advantages associated with metal-oxide-semiconductor-field-effect-transistors (MOSFET) make MOSFETs potentially very useful in analog circuits. For example, MOSFETs typically have virtually infinite input resistance and zero offset voltage, both of which are important in terms of analog design. However, because MOSFETs typically have a relatively low open-loop gain and relatively low transconductance, bipolar junction transistors were generally preferred over MOSFETs for use in analog circuits.

Several methods for increasing the output resistance of transistors used in analog circuits have been developed. For example, in Csanky, "Combing FET's for Higher Gains", *Electronic Design*, Sept. 27, 1963 at p. 36, the author discloses a circuit in which the source of a first junction field effect transistor ("JFET") is connected to the drain of a second JFET, while the gate of the first JFET is connected to the source of the second JFET. By combining the JFETs in this manner, the output resistance of the pair of JFETs is greater than the output resistance of each of the JFETs individually. Because open-loop gain is a function of the transconductance of a circuit multiplied by the output resistance, the open-loop gain of the JFETs collectively also was greater than each JFET individually. See also Csanky, U.S. Pat. No. 3,271,633. Another method for increasing the output resistance of MOSFETs is described in Grey et al., "MOS Operational Amplifier—A Tutorial Overview", *IEEE Journal of Solid State Circuits*, v. SC-17, n. 6, December 1982. In this reference, a cascode circuit using four MOSFETs is disclosed in which the output resistance and hence the open-loop gain is increased.

The references discussed above well illustrate the void in the art associated with amplifiers used in analog circuits. Methods which used MOSFETs generally required a relatively large number of components to achieve the desired gain. In addition, the methods which used JFET suffered from the disadvantages of having relatively small increase in output resistance as well as having low input resistance. For example, the output resistance of JFET circuits using the method described above was typically 50 Mohms.

SUMMARY OF THE INVENTION

According to the preferred embodiment of the present invention, a method and apparatus for amplifying signals is disclosed. In one embodiment, the apparatus comprises a first MOSFET having a gate for receiving input signals as well as a drain and a source. The apparatus further comprises a second MOSFET having a drain, a source and a gate. The second MOSFET is a delpetion mode device having a substantially greater drain saturation current than the first MOSFET. The drain of the first MOSFET is connected to the source of the second MOSFET through a first conductor, while the source of the first MOSFET is connected to the gate of the second MOSFET through a second conductor. Finally, the apparatus further comprises a conductor for connecting the drain of the second MOSFET to a biasing source to apply sufficient voltage to cause saturation of the first and second MOSFETs.

BRIEF DESCRIPTION OF THE DRAWINGS

The various advantages of the present invention will become apparent to one skilled in the art by reding the following specification and by reference to the drawings in which.

DESCRIPTION OF THE PREFERRED EMBODIMENTS

Figure 1:
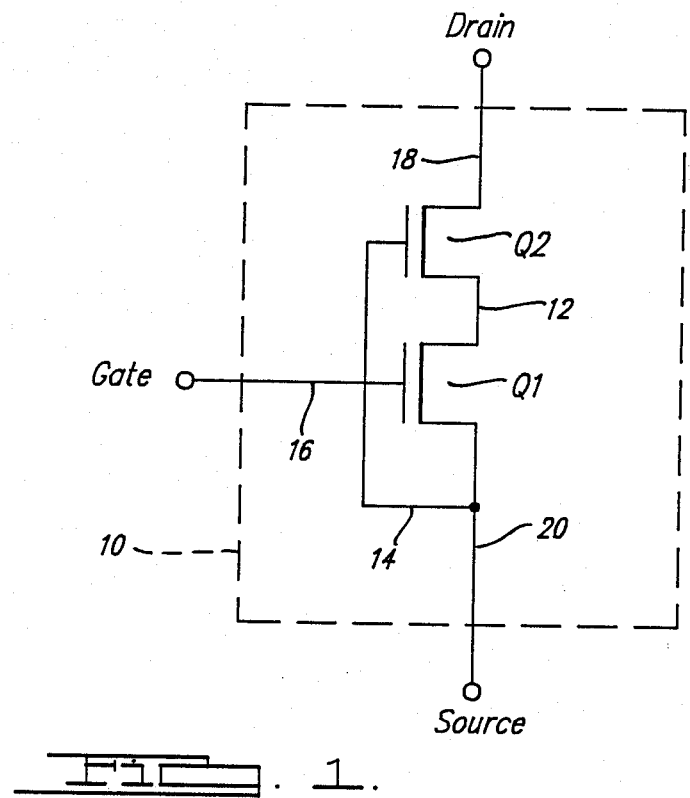
FIG. 1 is a schematic diagram of the apparatus according to the first preferred embodiment of the present invention.

Referring to FIG. 1, the apparatus 10 is shown which has a drain, a gate and a source. The apparatus 10 comprises a first transistor Q1 and a second transistor Q2. Both the transistor Q1 and the transistor Q2 are n-channel metal-oxide-semiconductor-field-effect-transistors (MOSFET), and therefore have virtually infinite input resistance and zero offset voltage. The drain of the transistor Q1 is connected to the source of the transistor Q2 through the conductor 12 as well as a conductor 20 electrically connecting the source of the transistor Q1 with the source of the apparatus 10. In addition, the source of the transistor Q1 is connected to the gate of the transistor Q2 through a conductor 14. A conductor 16 is connected to a gate of the transistor Q1 to provide an input voltage to the apparatus 10. Further, a conductor 18 is also connected between the drain of the transistor Q2 through the drain of the apparatus 10 to a biasing source (not shown) to provide means for biasing the drain of the transistor Q2. The remaining parameters of transistors Q1 and the transistor Q2 are chosen according to a set of selection rules which permit optimum performance of the apparatus 10. These rules are as follows:

(1) the transistor Q2 is a depletion mode transistor;

(2) both the transistor Q1 and the transistor Q2 operate in their saturation region; and (3) under similar bias conditions, the transistor Q2 in common gate operation exhibits a larger drain saturation current than the transistor Q1 in common source operation, i.e., $I_{D1}$ as a function of $V_i$ [$I_{D1} = \beta_2/2(V_i - V_{T1})^2$] is less than $I_{D2}$ as a function of $V_{SG2}$ [$I_{D2} = \beta_2/2(V_{P2} - V_{SG2})$] with $V_{DD}$ greater than $V_{P2}$, where the variables are defined in the Table at the end of this description.

By using these selection rules, an output resistance of the apparatus 10 is greater than if the selection rules are not used. For example, the output resistance of the apparatus 10 may typically be 300 Mohms when the selection rules are used, while the output resistance of similar circuits formed without the use of the selection rules may typically be less than 1 Mohms. Accordingly, the open-loop gain of the apparatus 10 using the selection rules is greater than the open-loop gain if the selection rules are not used.

Figure 2:
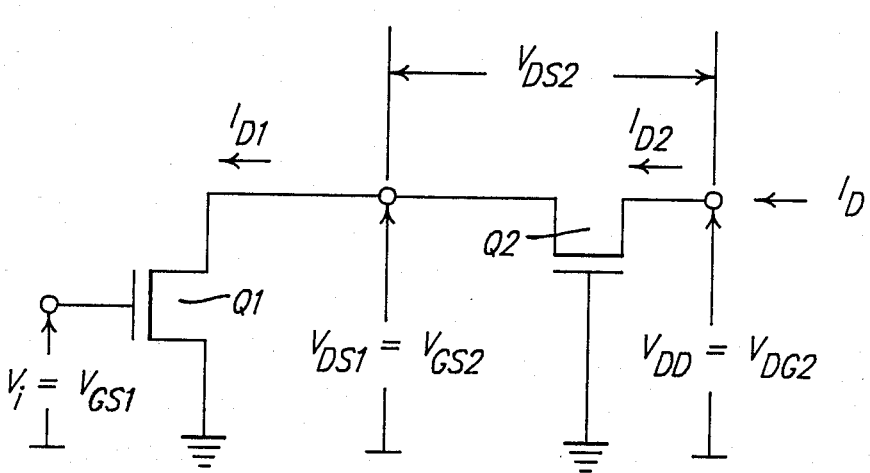
FIG. 2 illustrates the biasing conditions associated with the apparatus shown in FIG. 1.

To describe the operation of the selection rules, reference will be made to FIG. 2 which illustrates the biasing conditions associated with the transistor Q1 and the transistor Q2. First consider the case where a variable bias voltage $V_{DD}$ is applied to the drain of the transistor Q2 while the input voltage $V_i$ is held constant at a voltage less than the threshold voltage $V_{T1}$ of the transistor Q1. Under these conditions, the transistor Q1 is nonconducting while the transistor Q2 is conducting. As the variable bias voltage $V_{DD}$ is increased from zero, substantially all of the variable bias voltage $V_{DD}$ appears as the drain-source voltage $V_{DS1}$ of the transistor Q1, i.e., $V_{DS1}$ is approximately equal to $V_{DD}$. Since the drain-source voltage $V_{DS1}$ of the transistor Q1 is equal to the gate-source voltage $V_{GS2}$ of the transistor Q2, the drain-source voltage $V_{DS2}$ of the transistor Q2 is approximately zero. Note that as the variable bias voltage $V_{DD}$ increases, the transistor Q2 is driven toward cut-off thereby reducing the current handling capability of the transistor Q2. Under these input bias conditions, the drain current of each of the transistors Q1 and Q2 is approximately zero (i.e., $I_{D1}=I_{D2}=0$).

Next consider the case where the input voltage $V_i$ is held constant at a value greater than $V_{T1}$. In this case, both the transistor Q1 and the transistor Q2 are conducting. As the variable bias voltage $V_{DD}$ is increased from zero, the sum of the drain-source voltages of the transistors Q1 and Q2 will equal $V_{DD}$:

$$V_{DS1}+V_{DS2}=V_{DD} \quad (1)$$

with the voltage division such that the drain current $I_{D1}$ of the transistor Q1 is equal to the drain current $I_{D2}$ of the transistor Q2. As the variable bias voltage $V_{DD}$ is further increased, the transistor Q1 or the transistor Q2 enters saturation depending on whether $V_{DS1}=V_{DSAT1}$ occurs before or after the occurrence of $V_{DS2}=V_{DSAT2}=V_{P2}$. The conditions defined by Equation (1) must hold under all circumstances, and the drain current $I_{D1}$ of the transistor Q1 must always equal the drain current $I_{D2}$ of the transistor Q2.

Optimum interaction occurs between the transistor Q1 and the transistor Q2 when the transistor Q1 enters saturation before the transistor Q2. This occurs when the threshold voltage $V_{T1}$ of the transistor Q1 subtracted from the input voltage $V_i$ is greater than the pinch-off voltage $V_{P2}$ of the transistor Q2. Accordingly, the transistor Q1 enters saturation before the transistor Q2 when:

$$(V_i-V_{T1})<V_{P2} \quad (2)$$

After the transistor Q1 enters saturation, there is only a small change in its drain current $I_{D1}$ for a large change in its drain-source voltage $\Delta(V_{DS1}-V_{DSAT1})$. Because the output resistance $r_{o1}$ of the transistor Q1 is equal to the derivative of the drain voltage $V_{DS1}$ with respect to drain current $I_{D1}$ while the gate-source voltage $V_{GS1}$ is held constant, the change in fthe drain current $I_{D1}$ of the transistor Q1 can be expressed as follows:

$$\Delta I_{D1}=(1/r_{o1})\Delta(V_{DS1}-V_{DSAT1}) \quad (3)$$

Further increases in the variable bias voltage $V_{DD}$ results in a much smaller increase in the drain current $I_{D2}$ of the transistor Q2 as the transistor Q2 is also in saturation. The resultant change in the drain current $I_{D2}$ of the transistor Q2 as a function of the variable bias voltage $V_{DD}$ can be expressed as:

$$\Delta I_{D2}=(1/r_{o2})\Delta(V_{DD}-V_{P2})-g_{m2}\Delta V_{SG2} \quad (4)$$

where $g_{m2}$ refers to the transconductance of the transistor Q2 at its point of operation.

It will be noted that the change in saturation voltage $V_{DSAT1}$ of the transistor Q1 subtracted from the drain-source voltage of the transistor Q1 is equal to the change in fthe source-gate voltage $\Delta V_{SG2}$ of the transistor Q2. Accordingly, because the change in drain current $I_{D1}$ is equal to the change in drain current $I_{D2}$, Equation (4) may be rewritten as follows:

$$\Delta I_D = \frac{\Delta(V_{DD} - V_{P2})}{r_{o2}(1 + g_{m2}r_{o1})} \quad (5)$$

Since the output resistance $r_o$ of the apparatus 10 may be defined as drain voltage with respect to change in drain current with the gate voltage held constant, the output resistance $r_o$ of the apparatus 10 may be calculated as follows:

$$\frac{\Delta(V_{DD} - V_{P2})}{\Delta I_D} = r_o = r_{o2}(1 + g_{m2}r_{o1}) \quad (6)$$

Accordingly, the output resistance $r_o$ of the apparatus 10 is substantially greater than the output resistance of either the transistor Q1 or the transistor Q2 individually. Because the output resistance of the apparatus 10 is related to its open-loop gain, the open-loop gain of the apparatus 10 is also increased. For example, in one embodiment, the transconductance $g_m$ approximately equals 300 μmhos at 100 microamps, and $r_{o1}=r_{o2}=500$ K ohms. Using Equation (6), the output resistance $r_o$ of the apparatus 10 is approximately 150 times greater than the output resistances $r_{o1}$ and $r_{o2}$ of the transistors Q1 and Q2.

Figure 3:
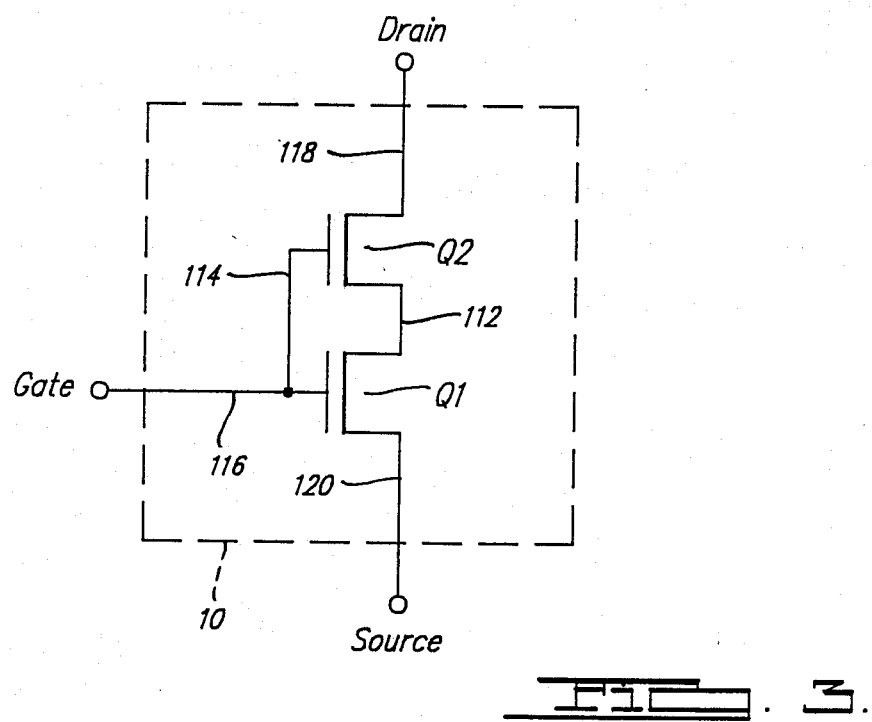
FIG. 3 is a schematic diagram of the apparatus according to the second preferred embodiment of the present invention.

The second preferred embodiment of the present invention is shown in FIG. 3. In this embodiment, the apparatus 10 comprises a first transistor Q1 and a second transistor Q2, both of which are metal-oxide-semiconductor-field-effect-transistors (MOSFET). The source of the transistor Q2 is connected to the drain of the transistor Q1 by means of the conductor 112, and the gate of the transistor Q2 is connected to the gate of the transistor Q1 by means of the conductor 114. Further, a conductor 116 is also connected to the gate of the transistor Q1 to provide means for providing input potential to the gate of the transistor Q1. In addition, a conductor 118 is connected between the drain of the transistor Q2 and a biasinfg source (not shown) so as to provide means for biasing the transistor Q2, while a conductor 120 is connected between the source of the transistor Q2 and the source of the apparatus 10. Finally, both the transistor Q1 and the transistor Q2 are enhancement mode n-channel MOSFETs which are generally more commercially available than depletion mode MOSFETs.

To optimize performance of the apparatus 10, the transistors Q1 and Q2 are selected according to a set of selection rules. These selection rules are as follows:

(1) The drain current $I_{D2}$ of the transistor Q2 is larger than the drain current $I_{D1}$ of the transistor Q1 under the same bias conditions.

(2) the saturation current $I_D$ of the apparatus 10 is less than $I_{Dmax}$ where:

$$I_D \leq I_{Dmax} = (\beta^2/2)(V_{T1} - V_{T2})^2 \qquad (7)$$

By applying these selection rules, the output resistance of the apparatus 10 is much grreater than the output resistance of the apparatus 10 designed without the use of the election rules. Accordingly, the open-loop gain of the apparatus 10 is greater when the selection rules are used. Because the transistors Q1 and Q2 are enhancement mode devices, the apparatus of the second preferred embodiment is easier to fabricate than that of the first preferred embodiment.

Figure 4:
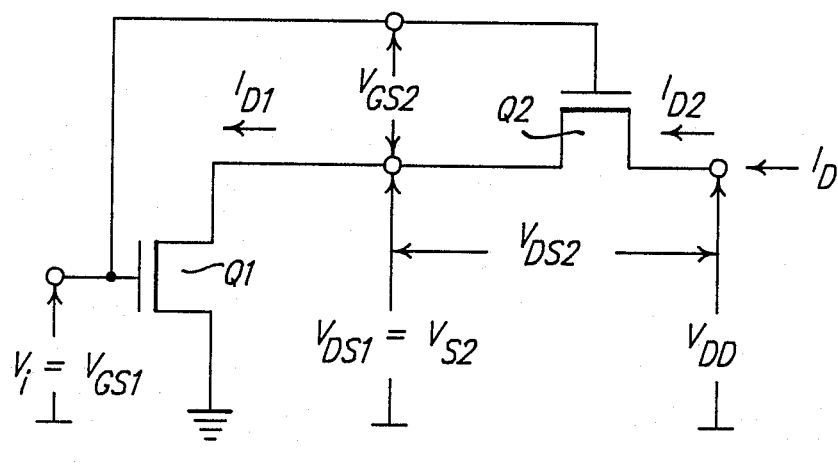
FIG. 4 illustrates the biasinbg conditions associated with the apparatus shown in FIG. 3.

The operation of the apparatus 10 according to the second preferred embodiment of the present invention will be made with reference to the biasing conditions shown in FIG. 4. First consider the case where a variable bias voltage $V_{DD}$ is applied to the drain of the transistor Q1, while the input voltage $V_i$ is held constant at a value less than the threshold voltage $V_{T1}$ of the transistor Q1. Under these circumstances, the transistor Q1 is nonconducting while the transistor Q2 may either be conducting or nonconducting depending whether $V_i$ is less than or greater than the threshold voltage $V_{T2}$ of the transistor Q2.

As one of the conditions for optimum interaction of the transistors Q1 and Q2 is that the threshold voltage $V_{T1}$ of the transistor Q1 be greater than the threshold voltage $V_{T2}$ of the transistor Q2, we will first consider the case where the transistor Q1 is nonconducting while the transistor Q2 is conducting (i.e., $V_{T2} < V_i < V_{T1}$). As the variable bias voltage $V_{DD}$ is increased from zero, practically all of the variable bias voltage $V_{DD}$ appears as the drain-source voltage $V_{DS1}$ of the transistor Q1 (i.e., $V_{DS1}$ approximately equals $V_{DD}$.) Since the drain-source voltage $V_{DS1}$ of the transistor Q1 is also the source voltage of the transistor Q2, the drain-source voltage $V_{DS2}$ of the transistor Q2 is approximately equal to zero. Note that an increase in the source voltage of the transistor Q2 reduces the current handling capability of the transistor Q2. When $V_{DD}$ reaches the value of $$V_i - V_{DD} = V_i - V_{DS1} = V_{T2} \qquad (8)$$

the transistor Q2 becomes nonconducting and any further increase in variable bias voltage $V_{DD}$ will be divided between $V_{DS1}$ and $V_{DS2}$ so that $I_{D1} = I_{D2}$.

Next consider the case where the input voltage $V_i$ is held constant at a value greater than the threshold voltage $V_{T1}$ of the transistor Q1. In this case, both the transistor Q1 and the transistor Q2 are conducting. As the variable bias voltage $V_{DD}$ is increased from zero, the sum of the two drain-source voltages will equal $V_{DD}$:

$$V_{DD} = V_{DS1} + V_{DS2} = V_{DS1}\left(1 + \frac{V_{DS2}}{V_{DS1}}\right) \qquad (9)$$

with the voltage division such that the drain current $I_{D1}$ of the transistor Q1 is equal to the drain current $I_{D2}$ of the transistor Q2.

As the variable bias voltage $V_{DD}$ is increased further, the transistor Q1 or the transistor Q2 enters saturation depending on whether $V_{DS1} = V_{DSAT1}$ occurs before or after the occurrence of $V_{DS2} = V_{DSAT2}$. Note that the conditions defined by Equation (9) will hold under all circumstances, and that the drain current $I_{D1}$ of the transistor Q1 be equal the drain current $I_{D2}$ of the transistor Q2.

Optimum interaction occurs between the transistor Q1 and the transistor Q2 when the transistor Q1 enters saturation before the transistor Q2. A better understanding of what influences the saturation condition can be obtained from reviewing the expression of the drain current $I_D$ of a MOSFET operating in the triode region in common source configuration:

$$I_D = \beta[(V_G - V_T)V_{DS} - (V_{DS}^2/2)] \qquad (10)$$

Saturation occurs when the drain-source voltage $V_{DS}$ is equal to the gate voltage $V_G$ less the threshold voltage $V_T$. Since $V_G$ is constant, the condition for saturation to occur is a function of the drain-source voltage $V_{DS}$. Accordingly, to insure that the transistor Q1 enters saturation before the transistor Q2, the drain-source voltage $V_{DS1}$ of the transistor Q1 should be much greater than the drain-source voltage $V_{DS2}$ of the transistor Q2. This condition will be satisfied if the current handling capability of the transistor Q2 is larger than the current handling capability of the transistor Q1. Comparing the drain current $I_{D1}$ of the transistor Q1 to the drain current $I_{D2}$ of the transistor Q2, the following can be obtained:

$$I_{D1} = \beta_1[(V_{GS1} - V_{T1})V_{DS1} - (V_{DS1}^2/2)] \qquad (11)$$

$$I_{D2} = \beta_2[(V_{GS2} - V_{T2})V_{DS2} - (V_{DS2}^2/2)] \qquad (12)$$

Note that while the gate-source voltage $V_{GS1}$ of the transistor Q1 is equal to the input voltage $V_i$, te gate-source voltage $V_{GS2}$ of the transistor Q2 will be equal to the input voltage $V_i$ less the drain-source voltage $V_{DS1}$ of the transistor Q2. Under all circumstances, the drain current $I_{D1}$ of the transistor Q1 is equal to the drain current $I_{D2}$ of the transistor Q2.

To satisfy the requirement than the drain-source voltage $V_{DS1}$ of the transistor Q1 be much greater than the drain-source voltage $V_{DS2}$ of the transistor Q2, it is required that $$\beta_2 > \beta_1 \qquad (13)$$

$$V_{T2} < V_{T1} \qquad (14)$$

To clarify the conditions set forth in the Equations (13) and (14), it is known that for the transistor Q1:

$$V_{GS1} - V_{T1} = V_i - V_{T1} \qquad (15)$$

and for the transistor Q2:

$$V_{GS2} - V_{T2} = V_1 - V_{DS1} - V_{T2} \qquad (16)$$

For the drain current $I_{D2}$ of the transistor Q2 to be much greater than the drain current $I_{D1}$ of the transistor Q1 for giving input voltage $V_i$, the input voltage $V_i$ less the drain-source voltage $V_{DS1}$ of the transistor Q1 less the threshold voltage $V_{T2}$ of the transistor Q2 must be greater than zero. This must be valid for the saturation current $I_{DSAT2}$ of the transistor Q2 as well as for $I_{DSAT1}$ of the transistor Q1. Saturation for the transistor Q1 occurs when the drain-source voltage $V_{D1}$ of the transistor Q1 equals:

$$V_{DS1} = (V_i - V_{T1}) = V_{DSAT1} \quad (17)$$

When applying Equation (17) to Equation (11), the saturation current $I_{DSAT1}$ for the transistor Q1 is obtained:

$$I_{DSAT1} = (\beta_1/2)(V_i - V_{T1})^2 \quad (18)$$

Similarly, saturation occurs for the transistor Q2 when $$V_{DS2} = (V_{GS2} - V_{T2}) = (V_i - V_{DSAT1} - V_{T2}) = (V_{T1} - V_{T2}) \quad (19)$$

When applying Equation (19) to Equation (12), the saturation current $I_{DSAT2}$ for the transistor Q2 is obtained $$I_{DSAT2} = \beta_2/2)(V_{T1} - V_{T2})^2 \quad (20)$$

Note that $I_{DSAT2}$ is independent of $V_i$ and therefore Equation (20) defines the maximum drain current $I_D$ of the apparatus 10, which assures optimum interactiobn between the transistor Q1 and the transistor Q2. When the drain current $I_D$ of the apparatus 10 exceeds the maximum drain current $I_{Dmax}$ of the apparatus 10, there is interaction between the transistor Q1 and the transistor Q2 and increased output resistance can be obtained, but the conditions are not optimized.

It should be understood that the invention was described in connection with the particular example thereof. Other modifications will be apparent to those skilled in the art after study of the specification, drawings and following claims.

TABLE

| Term | Description |
| --- | --- |
| $V_{DD}$ | Variable bias voltage |
| $V_{GS1}, V_{GS2}$ | Gate-source voltages of transistors Q1 and Q2 respectively |
| $V_{DS1}, V_{DS2}$ | Drain-source voltage of transistors Q1 and Q2 respectively |
| $V_{DSAT1}, V_{DSAT2}$ | Saturation voltages of transistors Q1 and Q2 respectively |
| $r_o, r_{o1}, r_{o2}$ | Output resistance of the apparatus, the transistor Q1 and the transistor Q2 repectively |
| $V_{T1}, V_{T2}$ | Threshold voltages for transistors Q1 and Q2 repsectively |
| $V_{P1}, V_{P2}$ | Pinch-off voltage of transistors Q1 and Q2 respectively |
| $I, I_{D1}, I_{D2}$ | Drain current of the apparatus, the transistor Q1 and the transistor Q2 respectively |
| $I_{Dmax}$ | Maximum drain current of the apparatus |
| $\beta_1, \beta_2$ | $\dfrac{W}{L} C_o \mu$ of the transistors Q1 and Q2 respectively |

What is claimed is:

1. An apparatus comprising: a first MOSFET having a drain, a source, and a gate;
   means for connecting the tate of said first MOSFET to receive an input signal;
   second MOSFET having a drain, a source and a gate, said second MOSFET being a depletion mode device and having a substantially greater drain saturation current than said first MOSFET;
   means for electrically connecting the drain of said first MOSFET to the source of said second MOSFET;
   means for electrically connecting the gate of said second MOSFET to the source of said first MOSFET; and
   means for providing a sufficient biasing voltage to the drain of said second MOSFET to cause saturation of said first and second MOSFETs.

2. The apparatus of claim 1, wherein said first and second MOSFETs satisfy the following equations:

$$(\beta_1/2)(V_i - V_{T1})^2 < (\beta_2/2)(V_{P2} - V_{SG2})^2$$

with $$V_{DD} > V_{P2}$$

where $$\beta_1 = (W_1/L_1)C_{o1}\mu_1$$

$$\beta_2 = (W_2/L_2)C_{o2}\mu_2$$

$W_1, W_2$ = widths of the channel forming said first and second MOSFET respectively;
$L_1, L_2$ = lengths of the channel forming said first and said second MOSFET respectively;
$C_{o1}, C_{o2}$ = capacitances of the gate oxide forming said first and said second MOSFET respectively;
$\mu_1, \mu_2$ = mobility of the charge carriers in said first or second MOSFET respectively;
$V_i$ = input voltage to said apparatus;
$V_{T1}$ = threshold voltage of said first MOSFET;
$V_{P2}$ = pinch-off voltage of said second MOSFET; and
$V_{SG2}$ = the source-gate voltage of said second MOSFET.

3. The apparatus of claim 1, wherein said first MOSFET is an enhancement mode device.

4. The apparatus of claim 1, wherein said first and second MOSFETs are n-channel devices.

5. The apparatus of claim 1, wherein said means for electrically connecting the drain of said first MOSFET to the source of said second MOSFET is operable to cause the output resistance of said apparatus to be greater than 50 Mohms.

6. A method for amplifying an analog signal comprising:
   delivering said analog signal to a first MOSFET having a drain, a source and a gate, said first MOSFET being operated in its saturation region;
   delivering the output from the source of said first MOSFET to a second MOSFET having a drain, a source and a gate, the source of said second MOSFET electrically communicating with the drain of said first MOSFET and the source of said first MOSFET electrically communicating with the gate of said second MOSFET, said second MOSFET being a depletion mode device and being operated in its saturation region, said second MOSFET further having a larger drain saturation current in common gate operation than said first MOSFET in common source operation under substantially the same bias conditions; and generating an output resistance greater than the output resistances of said first MOSFET and said second MOSFET.

7. The method of claim 6, wherein said first and second MOSFETs satisfy the following equations:

$$(\beta_1/2)(V_i - V_{T1})^2 < (\beta_2/2)(V_{P2} - V_{SG2})^2$$

with $$V_{DD} > V_{P2}$$

where $$\beta_1 = (W_1/L_1)C_{o1}\mu_1$$

$$\beta_2 = (W_2/L_2)C_{o2}\mu_2$$

$W_1$, $W_2$ = widths of the channel forming said first and second MOSFET respectively;
$L_1$, $L_2$ = lengths of the channel forming said first and said second MOSFET respectively;
$C_{o1}$, $C_{o2}$ = capacitances of the gate oxide forming said first and said second MOSFET respectively;
$\mu_1$, $\mu_2$ = mobilities of the charge carriers in said first or second MOSFET respectively;
$V_i$ = input voltage to said apparatus;
$V_{T1}$ = threshold voltage of said first MOSFET;
$V_{P2}$ = pinch-off voltage of said second MOSFET; and
$V_{SG2}$ = the source-gate voltage of said second MOSFET.

8. The method of claim 7, wherein said first MOSFET and said second MOSFET are operable to cause the output resistance of the device formed by said first and second MOSFETs to be greater than 50 Mohms.

9. The method of claim 8, wherein said first MOSFET is an emhancement mode device.

10. The method of claim 9, wherein said first and second MOSFET are n-channel devices.

11. An apparatus for amplifying an input signal comprising:
a first MOSFET having a drain, source and a gate;
a second MOSFET having a drain, source and a gate, the drain current of said second MOSFET being larger than the drain current of said first MOSFET under substantially the same bias conditions;
means for electrically connecting the drain of said first MOSFET to the source of said second MOSFET;
means for electrically connecting the gate of said first MOSFET to the gate of said second MOSFET; and
means for providing a biasing voltage sufficient to cause the drain current through said second MOSFET of less than $$(\beta_2/2)(V_{T1} - V_{T2})^2$$

where $$\beta_2 = (W_2/L_2)C_o\mu$$

$W_2$ = width of the channel forming said second MOSFET;
$L_2$ = length of the channel forming said second MOSFET;
$C_o$ = capacitance of the gate oxide forming said first MOSFET;
$\mu$ = mobility of charge carriers in said second MOSFET; and
$V_{T1}$, $V_{T2}$ = threshold voltages of said first and second MOSFETs respectively.

12. The apparatus of claim 11, wherein said first and second MOSFETs are enhancement mode devices.

13. The apparatus of claim 11, wherein said first and second MOSFETs are n-channel devices.

14. The apparatus of claim 11, wherein said first MOSFET and said second MOSFET are operable to cause the output resistance of said apparatus to be greater than 50 Mohms.

15. A method for amplifying an analog signal comprising:
delivering said analog signal to a first MOSFET having a drain, a source and a gate, said first MOSFET being operated in its saturation region;
delivering said analog signal to a second MOSFET having a drain, source and a gate, the source of said second MOSFET being connected to the drain of said first MOSFET, the drain current of said second MOSFET being larger than the drain current of said first MOSFET; and
providing a sufficient baising voltage to the drain of said second MOSFET so as to generate a drain current through said second MOSFET of less than $$(\beta_2/2)(V_{T1} - V_{T2})^2$$

where $$\beta_2 = (W_2/L_2)C_o\mu$$

$W_2$ = width of the channel forming said second MOSFET;
$L_2$ = length of the channel forming said second MOSFET;
$C_o$ = capacitance of the gate oxide forming said first MOSFET;
$\mu$ = mobility of charge carriers in said second MOSFET; and
$V_{T1}$, $V_{T2}$ = threshold voltages of said first and second MOSFETs respectively.

16. The method of claim 15, wherein said first and second MOSFETs are enhancement mode devices.

17. The method of claim 15, wherein said first and second MOSFETs are n-channel devices.

18. The method of claim 15, wherein said first MOSFET and said second MOSFET are operable to cause the output resistance of the device formed by said first and second MOSFETs to be greater than 50 Mohms.

* * * * *